United States Patent [19]

Eckert, Jr. et al.

[11] 3,836,792

[45] Sept. 17, 1974

[54] FOUR STAGE STORAGE ENHANCED LOGIC CIRCUIT

[75] Inventors: John P. Eckert, Jr., Gladwyne; Robert M. Bucks, Norristown, both of Pa.

[73] Assignee: Sperry Rand Corporation, New York, N.Y.

[22] Filed: Oct. 6, 1971

[21] Appl. No.: 187,035

Related U.S. Application Data

[63] Continuation of Ser. No. 842,276, July 16, 1969, abandoned.

[52] U.S. Cl. .................. 307/300, 307/214, 307/218, 307/319

[51] Int. Cl. .............................................. H03k 17/00

[58] Field of Search ............ 307/300, 214, 218, 319

[56] References Cited

UNITED STATES PATENTS

| | | | |
|---|---|---|---|
| 3,105,158 | 9/1963 | Nichols | 307/300 X |
| 3,105,159 | 9/1963 | Ditkofsky | 307/300 X |
| 3,217,181 | 11/1965 | Zuk | 307/218 |
| 3,275,854 | 9/1966 | Cianciola | 307/300 X |
| 3,283,180 | 11/1966 | Pressman | 307/218 X |
| 3,512,016 | 5/1970 | Haang et al. | 307/300 |
| 3,515,899 | 6/1970 | May | 307/214 |

OTHER PUBLICATIONS

Hand Book of Semiconductor Electronics by Hunter 10/56, pp. 15–48, TK 7872, Grp. 254.

Electronics Hot Carrier Diodes Switch in P. S. Krakauer et al., 7/63 pp. 53–55.

*Primary Examiner*—Rudolph V. Rolinec
*Assistant Examiner*—B. P. Davis
*Attorney, Agent, or Firm*—Rene A. Kuypers

[57] ABSTRACT

There is disclosed herein a four stage circuit which utilizes charge storage in a transistor together with its inverse Beta to obtain fast switching. A diode anti-saturation clamp is also utilized in one of the stages to enhance rapid switching. The circuit is designed such that it is suitable for integration in a monolithic semiconductor device.

15 Claims, 5 Drawing Figures

INVENTORS
ROBERT M. BUCKS
JOHN P. ECKERT, JR.
BY Rene A. Kuypers
ATTORNEY

FOUR STAGE STORAGE ENHANCED LOGIC CIRCUIT

This is a continuation, of application Ser. No. 842,276, filed July 16, 1969 now abandoned.

BACKGROUND OF THE INVENTION

The instant invention is related in general to the field of high speed switching circuits and in particular relates to a high speed switching circuit which is suitable for use in a computer logic system.

A known shortcoming of prior art high speed transistor logic circuitry has been the characteristic of a transistor to store charge while conducting in the forward direction. This characteristic of a transistor has been considered detrimental in certain applications since it prevents rapid switching. Consequently, various processing compromises have been undertaken by utilizing gold doping with respect to the silicon layer in the transistor to minimize the effect of storage. These expedients have added to the cost and have increased the complexity of microcircuit manufacture.

SUMMARY OF THE INVENTION

The instant invention has been designed to utilize in a beneficial manner the effect of stored charge in a transistor. There is disclosed herein a transistor logic circuit utilizing four transistor stages. The circuit can be operated in the negative AND or the positive OR logic configuration. When all four stages are of the NPN type of transistor the second stage of the logic circuit is operated in the conducting state and minority carriers are stored in the base-collector region thereof.

When the input to the first stage is altered, the second stage is reverse-biased thereby causing it to operate in the non-conducting state. The stored charge in the second state is thereby transferred to the third stage of the logic circuit. In addition, the inverse Beta characteristic of the second stage causes current to be added to the stored charge so that both effects operating in unison on the third stage causes it to be rapidly switched.

In order to prevent the third stage from being driven into saturation, a feedback circuit comprising a low capacitance diode is arranged in such a manner as to clamp the collector of the third stage thereby preventing it from conducting excessively. Accordingly, the third stage can rapidly revert to its original quiescent state when the input is again switched. The fourth stage comprises a transistor connected in the emitter follower configuration to provide a low impedance output.

The instant invention achieves numerous advantages over known prior art circuits. The circuits disclosed herein achieve lower dynamic loading than known commercial circuits operating at the same speed and power. The speed of a circuit multiplied by its power is the figure of merit and this result for the instant invention is better than that for the well known $T^2L$ (transistor-transistor logic) circuit. Thus for a given power the instant invention switches faster than the $T^2L$ circuit. On the other hand, if both circuits were operated at the same speed, more power could be consumed by the prior art circuits.

Another advantage which can be attributed to the present invention is that it is able to utilize a longer rise and fall time than prior art circuits but without increasing its propagation delay. A longer rise and fall time is useful in that a noise signal cannot as readily trigger the circuit on. In addition crosstalk between circuits is reduced thereby simplifying intercircuit wiring. Furthermore, the instant circuit can be operated in either the positive OR or the negative AND logic configuration thereby providing it with versatility. An additional advantage of the instant invention is that one side of the output signal is always referenced to ground or is at ground thereby simplifying the interfacing of several such circuits together since the input is adapted to receive such output signals. A significant advantage to be noted is that only one power supply voltage is required for operational purposes. This is of great importance when a plurality of such circuits must be utilized in providing a logical chain since it eliminates numerous components and interconnections.

Therefore, it is an object of this invention to provide a new and improved high speed logic circuit.

It is still another object of this invention to provide a high speed logic circuit suitable for integration in a monolithic semiconductor.

DESCRIPTION OF THE PREFERRED EMBODIMENTS

Figure 1B:
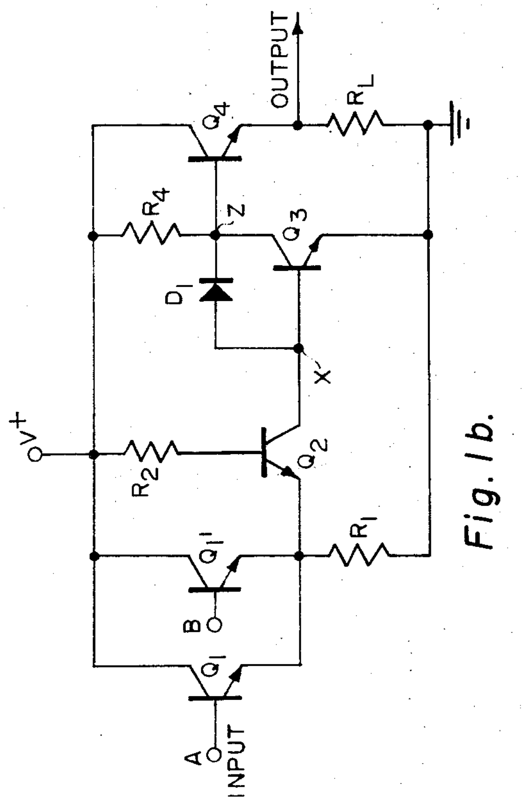
FIGS. 1*a* – 1*d* depict four embodiments of the present invention.
Figure 1D:
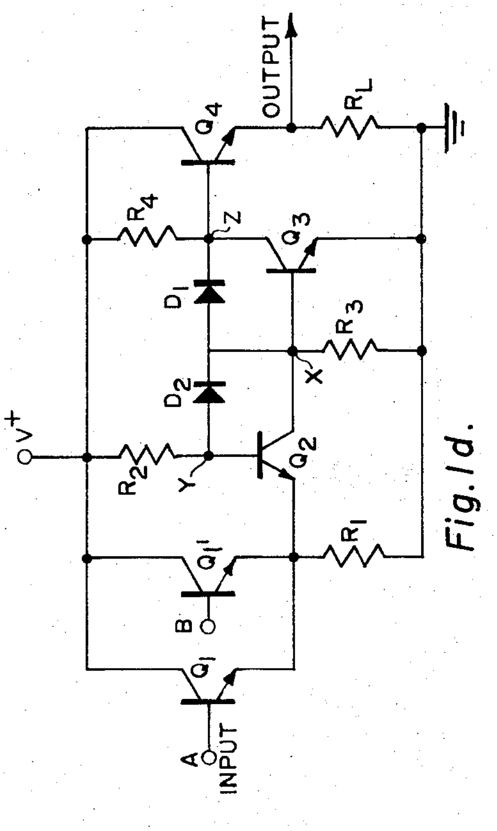
Figure 1A:
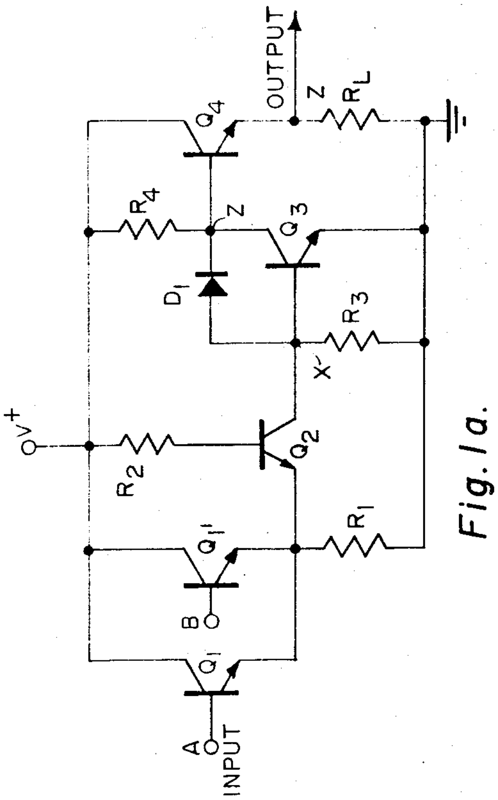

Referring now to FIG. 1a, it is seen that the logic circuit has four stages: namely, stage one comprising the two NPN transistors Q1 and Q'1 connected as emitter followers; the second stage comprising the NPN transistor Q2 connected in the common base configuration; the third stage comprising the NPN transistor Q3 connected as an inverter or common emitter; and the fourth stage comprising the NPN transistor Q4 which is connected as an emitter follower or as a common collector. The diode D1 which is connected across the base-collector elements of Q3 (i.e., across points X-Z) is a low capacitance fast recovery device, such as a Schottky device. In a second variation of the same circuit (see FIGS. 1*c* and 1*d*) a second diode D2 may be connected in series with diode D1 across terminals Z-Y. In this variation, diode D2 is preferably the Schottky diode and diode D1 is a conventional silicon diode. The resistor R3 is a resistor which is used for clean-up purposes as will be explained hereinafter. The single voltage for the entire circuit is provided by the positive supply, $V^+$.

The circuit of FIG. 1 may be varied into four different arrangements. In one arrangement, the Schottky diode D1 is connected across points X-Z. The clean-up resistor R3 may (FIG. 1*a*) or may not (FIG. 1*b*) be utilized in conjunction with the diode D1. In like manner, the present arrangement can be utilized with the two diodes D1 and D2 connected across point Y-Z. With the two diodes D1 and D2 connected in series across points Z-Y, the clean-up resistor R3 again may (FIG. 1*d*) or may not (FIG. 1*c*) be utilized. It can therefore be seen that the circuit of FIG. 1 can be employed in four different embodiments depending upon the utilization of one or two diodes and furthermore, whether or not the clean-up resistor R3 is used or not.

Referring now to the operation of the circuit of FIG. 1*a* for a single diode D1 and the clean-up resistor R3, input terminals A and B are both at ground potential when the circuit is in the quiescent state. Ground potential can be considered as a negative input signal. It will be shown that the circuit operates in the negative AND logic configuration. The respective emitters of Q1 and Q'1 are connected to ground potential via the resistor R1. Emitters of Q1 and Q'1 are slightly positive (approximately 0.45 volts) due to the path through R1, Q2 and R2 to V+. Accordingly, the base-emitter junctions are all at approximately the same potential and therefore Q1 and Q'1 are back-biased and their emitter-collector are in the high impedance state or are non-conducting. However, the base-emitter junction of Q2 is forward-biased since the base is connected to the positive voltage source V+ via the resistor R2 and the emitter is connected to ground via the resistor R1. Hence, the base-emitter junction is forward-biased and current flows from the supply V+ to ground via the resistors R1 and R2 and the base-emitter junction. Therefore, transistor Q2 reverts to the low impedance state and a current path is established from the voltage V+ to ground via the resistors R1 and R4, the base-collector junction of Q3 and the emitter-collector junction of Q2.

In addition, there is some current flow from the supply V+ to ground via resistors R3 and R4 and the base-collector junction of Q3. The two current paths above-described drops the supply voltage which is approximately four volts positive to approximately .5 volts positive at the base of Q3. The emitter of Q3 is connected to ground. The voltage at the base of Q3 therefore is below the threshold and it is insufficient to forward bias the base-emitter junction of Q3. Hence, during this period of operation Q3 remains in the high impedance or non-conducting state.

It should be noted herein that in view of current flow through Q2 via Q3 the collector of Q3 (i.e., terminal Z) is slightly higher in potential than the base of transistor Q3 (i.e., terminal X). Therefore the anode of diode D1 is less positive than its cathode and hence it is also back-biased. The voltage at terminal Z is applied to the base of Q4 and its emitter is connected to ground via resistor R2. This voltage difference places the base-emitter junction of Q4 above the conducting threshold and therefore current flows from $V^+$ to ground via resistors RL and R4 as well as through the base-emitter junction. Since the base-emitter junction of Q4 is forward-biased it provides a low impedance path and therefore current is conducted from $V^+$ to ground via resistor RL and the emitter-collector junction. Accordingly, the output terminal is a high voltage and is equal to the supply voltage $V^+$ minus the voltage drop through the collector-emitter junction of Q4. This output voltage is approximately 3.25 volts.

Summarizing the operation of the circuit when both input terminal A and B are at ground potential or when the circuit is in the quiescent state, it is seen that transistors Q1, Q'1 and Q3 as well as diode D1 are in the high impedance state whereas Q2 and Q4 are in the low impedance state. In addition, the flow of current through the collector-emitter junction of Q2 causes minority carrier storage to take place in its base-collector region. As is well known, minority carriers comprise electrons in a P type element or the base and holes in the N type element or the collector. Minority carrier storage can be considered as the charge on a capacitor or the formation of the battery across the base-collector junction due to the presence of excess holes and electrons in the transistor lattice structure. In known prior art microcircuits, it has been the practice to minimize minority carrier storage by means of gold doping of the silicon element.

It should be noted that for the negative input signals (i.e., ground signals) applied respectively to the terminals A and B of Q1 and Q'1, the signal at the output terminal is positive. This demonstrates that the circuit of FIG. 1 operates in the negative AND logical configuration. In other words, when both input A and input B are negative the output is positive.

Let us assume now that the input terminal A has a positive pulse applied thereto. Terminal B will remain at the ground potential although it should be understood that the circuit will work in the same manner should a positive pulse be also applied thereto. When a positive pulse is applied to terminal A, the base-emitter junction of Q1 is forward-biased and current flows from terminal A to ground via resistor R1 and the base-emitter. The base-emitter junction of transistor Q'1 is not forward-biased when the base is at ground since the emitter is also connected to ground via the resistor R1. Accordingly, a low impedance path exists through the collector-emitter junction of Q1 and current flows therethrough from the positive voltage source $V^+$ to ground via resistor R1.

The conduction of current through Q1 causes the upper terminal of resistor R1 to rise in potential and is equal to the supply voltage $V^+$ less the voltage dropped through the collector-emitter Q1.

The base-emitter junction of Q2 is therefore reverse-biased since the potential difference across this junction is not sufficient to cause it to conduct. Accordingly, Q2 no longer provides a low impedance path and the current stops flowing from $V^+$ to ground via the resistors R1 and R2 and the base-emitter of Q3.

As soon as transistor Q2 stops conducting, the base of Q3 begins to rise from 0.5 volts present thereat during the quiescent state. The emitter of Q2 now acts like a collector. Q3 is therefore turned on by current provided by path from $V^+$ to ground via resistor R2, the base-collector junction of Q2 and through the base-emitter junction of Q3. There is another path from base at Q3 the collector-emitter junction of Q2 through emitter-base of Q1 to $V^+$. The magnitude of the current through the second path depends on the inverse Beta of Q2. When the voltage at the base of Q3 reaches approximately 0.7 volts, the base-emitter junction thereof becomes forward-biased. Q3 is turned on very rapidly in view of two conditions which are present in the circuit. The first factor accounting for the rapid turn-on of Q3 is the minority carrier discharge through the base-emitter junction of transistor Q3.

As will be recalled, minority carrier storage is equivalent to a fully charged capacitor. This capacitor discharges very rapidly to ground via the base-emitter of Q3 and completes the circuit through the base-collector junction of Q2, resistor R2 and $V^+$. The current from Q2 directed to Q3 due to minority carrier storage is typically several times the steady state d.c. current.

The second factor accounting for the rapid turn-on of Q3 is provided by the inverse Beta characteristic of Q2. The inverse Beta of a transistor is the characteristic whereby it will tend to conduct a small amount of current in the reverse direction or from the emitter to the collector since the emitter is more positive than the collector. Therefore, the circuit path for the inverse Beta current is through the emitter-collector of Q2, the base-emitter of Q3 to the positive voltage Q1 base. Accordingly, the rapid turn-on of Q3 can be accounted for by the double hammered effect provided by the stored minority carriers and the inverse Beta current both flowing into the base-emitter junction of Q3.

As a result of the forward-biasing of the base-emitter junction of Q3, its collector-emitter junction becomes a low impedance path. Therefore, current is conducted from the positive supply $V^+$ to ground via the resistor R4 and the collector-emitter path of Q3. In the actual working embodiment, the conduction of current through Q3 causes the point Z or the cathode of diode D1 to drop to approximately 0.3 volts positive. Therefore, with the anode (i.e., point X) being at approximately 0.7 volts positive as previously discussed and the cathode being at 0.3 positive, the diode D1 becomes forward-biased. Consequently, current is conducted from $V^+$ to ground via resistor R2, the base-collector junction of Q2, the diode D1 and the low impedance collector-emitter junction of Q3. The diode D1 acts as a clamping device in that it clamps the collector of Q3 to a voltage whose value is 0.7 volts minus the voltage drop through diode D1. The clamping of the collector voltage of Q3 prevents the latter from being driven into saturation. In other words, by means of the feedback circuit provided by the diode D1, the potential difference across the emitter-collector junction of Q3 is minimized thereby preventing it from conducting heavily. As is understood, when a transistor conducts heavily it is difficult to turn it off rapidly since the device will want to continue to conduct momentarily after the proper turn-off signals have been applied. It should be noted hereat that the application of the feedback to the diode D1 is applied almost instantaneously with the turn-on of Q3.

The clamped collector voltage at point Z is applied to the base of Q4. Since the emitter of Q4 is connected to ground via resistor R2, the voltage applied across the base-emitter junction is below the forward bias threshold and consequently, Q4 is turned on. Consequently, the output terminal drops to ground potential from 3.25 volts positive. Accordingly, it can be seen that for a single positive pulse applied to terminal A the output terminal will be switched to a negative level or ground, and hence the above-described circuit operates in the invert positive OR logic configuration.

It should be noted that when the circuit reverts to the original quiescent state, the base-emitter of Q4 is again forward biased. It should further be noted that when Q3 was in the low impedance state, there was some minority carrier storage in the base-collector junction. The clean-up resistor R3 provides a rapid discharge path for this storage through the path which is directly connected to ground. The clean-up resistor R3 is not necessary to the operation of the circuit and its removal will not degrade performance to any extent.

Figure 1C:
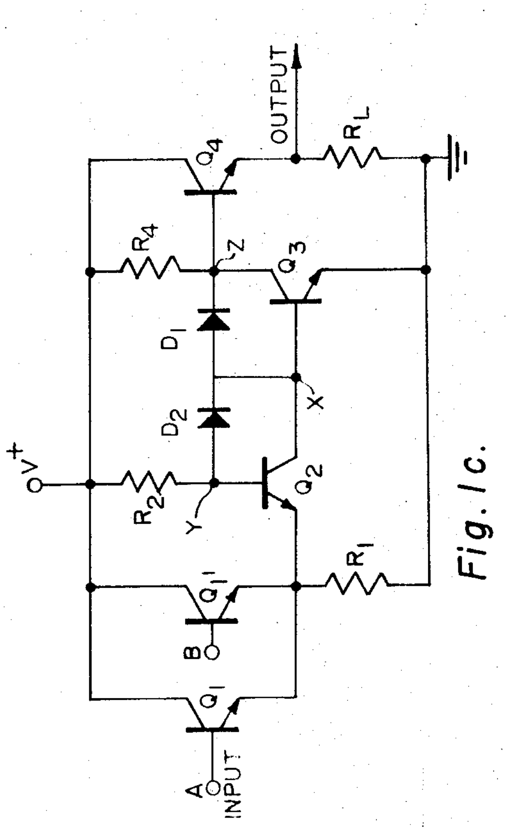

Another version of this storage enhanced logic circuit of this invention is obtained by connecting two diodes in series fashion across the points Y-Z as shown in FIGS. 1*c* and 1*d*. In other words, the single diode D1 is removed from across the terminals X-Z and the result is that the feedback signal is now arranged across two stages instead of one. In this particular arrangement D2 is the Schottky whereas D1 is a silicon diode. It should be understood that for various reasons, such as facility in manufacturing, it might be required that the diodes be reversed such that D1 is the Schottky diode and D2 is a silicon diode. It should be further understood that diodes D1 and D2 may both be Schottky diodes. The reason why in the preferred embodiment D2 is the Schottky diode and D1 is the silicon diode is that since the signal reaches D2 first and D1 second, the requirement is only that D2 be a fast recovery, low capacitance type. The operation of this aspect of the circuit will become clearer after the discussion below.

When the circuit embodying the two diode feedbacks is in the quiescent state or when both inputs are at ground, the circuit operates in the same manner previously described. Reviewing now the operation when a positive pulse is applied to either or both terminals A, B, transistor Q1 or Q'1 or both will conduct since the respective base-emitter junctions are forward-biased. The current conduction from the voltage supply $V^+$ to ground via the resistor R1 and the low impedance collector-emitter path will cause the emitter voltage of Q2 to rise. Hence, the base-emitter junction of Q2 will be below the forward conduction threshold so that the collector-emitter thereof reverts to the high impedance state. Therefore, the base of transistor Q3 rises so that its base-emitter junction becomes forward-biased and current is conducted from the positive supply voltage $V^+$ to ground via the resistor R2 and the base-collector junction of Q2. Therefore, the emitter-collector junction of Q3 is switched to the low impedance state and current is conducted from $V^+$ to ground via resistor R4 and the said collector-emitter junction. In the same manner as previously described, Q3 is turned on very rapidly because of the two-fold effect comprising the stored minority carriers in the base-collector region of Q2 as well as by its inverse Beta current.

In order to prevent the collector of Q3 from going into saturation as previously described, the collector (point Z) is again clamped to a voltage which prevents the transistor from over-conducting or from bottoming. However, instead of being clamped to the voltage at point X, point Z is now clamped to the voltage at point Y. The reason that point Z is clamped to point Y is to delay the clamping action to allow more time for the charge to be transferred to turn-on Q3 before saturation is limited. In other words, the feedback action from point Y to point Z is delayed since the current flowing from the left to the right direction through diodes D1 and D2 must pass through both stages before it becomes effective. This allows the stored minority carriers and the inverse Beta of Q2 to be fully effective since it traverses only a single stage and therefore operates faster than the feedback action.

This is to be contrasted with the circuit previously described in which feedback occurs from point X to point Z. Here the clamping action and the quick turn-on action occurs almost simultaneously. In the circuit using the two diode feedback circuit, the propagation delay is substantially improved at the expense of the additional diode. As in the previously described embodiment, the resistor R3 performs the function of a clean-up resistor and is utilized in conjunction with the minority carrier storage in the base-collector junction of transistor Q3. Accordingly, the resistor R3 may be utilized or it may be eliminated from the circuit when used with the dual diode configuration.

Figure 2:
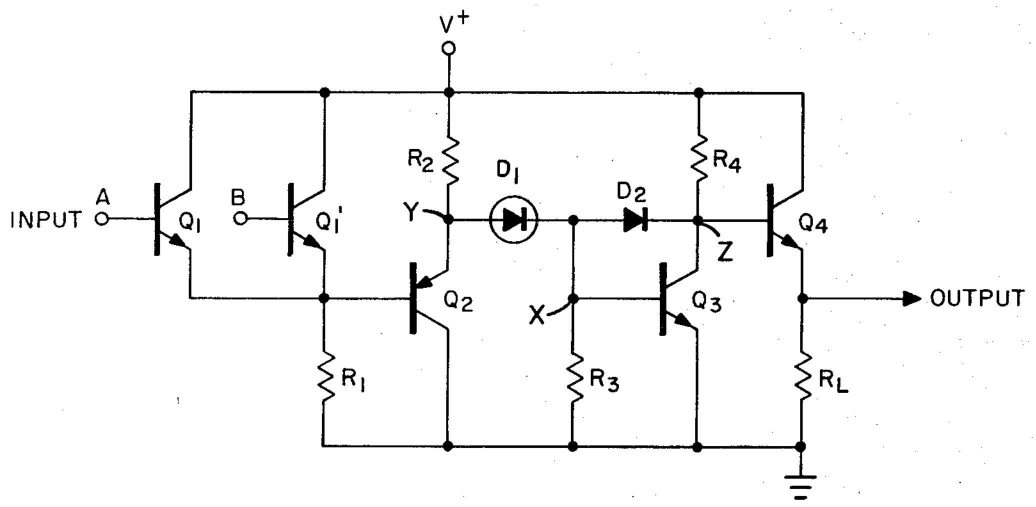
FIG. 2 shows another embodiment of the invention wherein one of the stages uses a PNP type transistor in conjunction with a storage diode.

Referring now to the circuit of FIG. 2, the second stage transistor Q2 is a PNP transistor connected as an emitter follower. In addition, a storage diode D1 is connected across terminals X-Y and a Schottky diode D2 is connected across terminal X-Z.

In operation, consider the base (terminal A) of Q1 to have a positive signal applied thereto. The base-emitter junction of Q1 will therefore be forward-biased and current is conducted from $V^+$ to ground via resistor R2 and the low impedance emitter-collector junction. The emitter voltage of Q1 will therefore rise to the value of the positive signal applied to terminal A minus the base-emitter drop. The base of Q2 is at the same potential causing Q2 to go to the high impedance state since the emitter is less positive than the base. Point Y therefore wants to rise to the value of $V^+$. When point Y rises to approximately 1.5 volts it stops and the storage diode D1 becomes forward-biased since the cathode is connected to point X which is further connected to ground via resistor R3.

The base-emitter junction of Q3 will also become forward-biased since point X will be sufficiently positive with respect to the emitter of Q3 which is connected to ground. Accordingly, a current flow is established from $V^+$ through the resistor R2, the storage diode D1 and the base-emitter junction of Q3 to ground. The collector-emitter junction of Q3 therefore reverts to the low impedance state and current flows therethrough to ground from $V^+$ and via resistor R4. The operation of diode D2 and Q4 operate in the manner previously described with respect to FIG. 1. However, it should be noted that the nature of the storage diode D1 is such that a charge is stored in its lattice structure when it conducts in the forward direction. This aspect will become significant in the discussion below.

When terminal A or the base of Q1 is returned to ground, its collector-emitter junction reverts to the high impedance state. When Q1 is turned-off the emitter-collector junction of Q2 reverts to the low impedance state since its base-emitter junction is forward-biased. This causes terminal Y to go toward ground. Normally, when the voltage at point Y went below 1.5 volts, diode D1 would disconnect if it were a perfect diode and Q3 would turn-off and excess charge in its base-collector junction would have to drain off through resistor R3. However, since D1 stores charge it will present a low impedance path in the reverse direction until the charge is swept out.

Hence, the stored minority charges present in Q3 are drained off through the emitter-collector of Q2 to ground via the low impedance reverse path (i.e., from point X to point Y) of diode D1. This current flow lasts until the charges are swept out of diode D1 after which time the latter stops conducting in the reverse direction and diode D1 disconnects. Some minority carrier charge is also drained off through the resistor R3 to ground in the manner previously described. In other words, Q3 is turned off very hard by discharging the stored minority carriers through the two mentioned paths. The operation of diode D2, Q3 and Q4 is the same as previously described. The advantage provides by the circuit in FIG. 2 is that it can use gold doped transistors to minimize minority carrier storage.

What is claimed is:

1. The logic circuit consisting of, a. A first circuit stage comprising a first semiconductor device having a relative high Inverse Beta characteristic and including means for storing minority charges;

b. means connected to the input of said first circuit stage for receiving logical input signals;

c. another circuit stage comprising a second semiconductor device coupled to the output of said first mentioned stage;

d. feedback means coupled across said second mentioned stage;

e. means to cause in a first mode of operation the conduction of current in the forward direction in said first semiconductor stage, the non-conduction of current in said second mentioned semiconductor stage and the storage of minority charges in said storing means;

and in the alternative, said last mentioned means causing in a second mode of operation the non-conduction of current in the forward direction, and the conduction of current in the reverse direction in said first stage based on the Inverse Beta of said first semiconductor, the forward conduction of current in said second mentioned stage and the flow of charges from said storing means into said second mentioned stage, said flow of charges into said second mentioned stage and said reverse current causing its rapid turn-on in the forward direction, and said feedback means preventing said second mentioned stage from conducting into saturation;

f. emitter follower means connected to the output of said second mentioned circuit stage.

2. The circuit in accordance with claim 1 wherein said first and second stages include NPN transistors and said means for storing charges comprises the base-collector junction of said first stage transistor.

3. The circuit in accordance with claim 2 wherein said feedback means comprises diode means connected across the base-collector junction of said second stage transistor.

4. The circuit in accordance with claim 3 wherein said diode means comprises a Schottky type diode.

5. The circuit in accordance with claim 2 wherein said feedback means comprises diode means connected across the base of said first stage transistor to the collector of said second stage transistor.

6. The circuit in accordance with claim 5 wherein said diode means comprises two diodes connected in series.

7. The circuit in accordance with claim 6 wherein said first diode connected to said base of said first stage transistor is a Schottky diode and said second diode connected to the collector of said second stage transistor is a silicon diode.

8. The circuit in accordance with claim 2 wherein said means connected to the input of said first circuit stage comprises NPN transistor stages which are connected in the emitter follower configuration to the input of said first stage transistor, said four stage circuit operating in the negative AND or in the positive OR logic configuration.

9. The circuit in accordance with claim 8 wherein one of said means coupled to said first and second stages for causing their conduction and non-conduction is a single power supply voltage which is connected to said four stage circuit.

10. The circuit in accordance with claim 2 wherein resistor means are further coupled between said first and second stages to ground potential wherein said resistor provides a minority carrier discharge path.

11. The logic circuit consisting of, a. a first circuit stage comprising a first semiconductor device;

b. means connected to the input of said first stage for receiving logical input signals;

c. another circuit stage comprising a second semiconductor device which is coupled to the output of said first stage;

d. storage diode means coupled between said first and second mentioned stages for storing charges;

e. feedback means coupled across said second mentioned stage;

f. means including a single voltage supply level to cause in a first mode of operation the non-conduction of current in the first stage, the conduction of current in said second stage and the storage of charge in said means coupled between said first and second stages; and in the alternative, said last mentioned means causing in a second mode of operation the conduction of current in the forward direction in said first stage and the non-conduction of current in said second mentioned stage and the flow of current in the reverse direction through said means for storing charge and through said second semiconductor device, said flow of current in the reverse direction causing the rapid turn-off of the second semiconductor device and said feedback means preventing said mentioned second semiconductor stage from conducting into saturation;

g. emitter follower means connected to the output of said second circuit stage.

12. The circuit in accordance with claim 11 wherein said first stage includes a PNP transistor and said second stage includes an NPN transistor and said storage diode is connected intermediate said first and second stages.

13. The circuit in accordance with claim 12 wherein said means connected to the input of said first stage comprises NPN transistor stages which are connected in the emitter follower configuration to the input of said first stage transistor.

14. The circuit in accordance with claim 12 wherein said feedback means comprises a Schottky diode connected across the base-collector junction of said NPN transistor.

15. The combination in accordance with claim 12 wherein resistor means are coupled between said first and second stages to ground potential, said resistor providing a minority carrier discharge path after said second stage NPN transistor reverts to the non-conducting state after being in the conducting state.

* * * * *